(12) United States Patent
Khetan et al.

(10) Patent No.: US 7,505,829 B2
(45) Date of Patent: Mar. 17, 2009

(54) SYSTEM, METHOD, AND ARTICLE OF MANUFACTURE FOR DETERMINING A PRODUCTIVITY RATE OF A MANUFACTURING SYSTEM

(75) Inventors: Raghunath P. Khetan, Troy, MI (US); Pravin Khurana, Rochester, MI (US); Ravi Duggirala, Farmington Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 454 days.

(21) Appl. No.: 11/301,629

(22) Filed: Dec. 13, 2005

(65) Prior Publication Data

US 2006/0161285 A1 Jul. 20, 2006

Related U.S. Application Data

(60) Provisional application No. 60/635,879, filed on Dec. 14, 2004, provisional application No. 60/635,881, filed on Dec. 14, 2004.

(51) Int. Cl.
*G06F 19/00* (2006.01)
*G05B 15/00* (2006.01)

(52) U.S. Cl. .......... 700/108; 700/46; 700/97; 700/98; 700/99; 700/100; 700/103

(58) Field of Classification Search .......... 700/46, 700/108, 97, 98, 99, 100, 103
See application file for complete search history.

(56) References Cited

U.S. PATENT DOCUMENTS

| | | | |
|---|---|---|---|
| 5,416,729 A | 5/1995 | Leon et al. | 364/578 |
| 5,465,221 A | 11/1995 | Merat et al. | |
| 5,841,659 A | 11/1998 | Tanaka et al. | |
| 5,996,702 A | 12/1999 | Hall | 172/4.5 |
| 6,735,489 B1 | 5/2004 | Khurana | 700/95 |

(Continued)

FOREIGN PATENT DOCUMENTS

EP 0 811 941 A2 12/1997

(Continued)

OTHER PUBLICATIONS

Wie-Y.F., "Concurrent Design for Optimal Quality and Cycle Time" 2001 Dissertation, Univ of Wisconsin-Madison p. 1-116.*

(Continued)

*Primary Examiner*—Albert DeCady
*Assistant Examiner*—Thomas H. Stevens
(74) *Attorney, Agent, or Firm*—Thomas W. Twoney

(57) ABSTRACT

A system, method, and article of manufacture for determining a productivity rate of a manufacturing system are provided. The manufacturing system has a first and second manufacturing cells. The first and second manufacturing cells has first and second machines, respectively. The method includes predicting a first cycle time indicating a time duration that a part is disposed in the first manufacturing cell. The method further includes predicting a second cycle time indicating a time duration that the part is disposed in the second manufacturing cell. The method further includes calculating a productivity rate of the first and second manufacturing system cells based on the first and second cycle times of the first and second manufacturing cells, respectively.

6 Claims, 12 Drawing Sheets

U.S. PATENT DOCUMENTS

| | | |
|---|---|---|
| 6,775,581 B2 | 8/2004 | Landers ................. 700/98 |
| 6,839,606 B2 | 1/2005 | Landers ................. 700/159 |
| 6,950,719 B2 | 9/2005 | Landers ................. 700/182 |
| 7,099,737 B2 | 8/2006 | Suh et al. |
| 2002/0059049 A1 | 5/2002 | Bradbury et al. |
| 2006/0129271 A1 | 6/2006 | Khurana et al. |
| 2007/0038329 A1 | 2/2007 | Khurana et al. |

FOREIGN PATENT DOCUMENTS

| | | |
|---|---|---|
| EP | 1 443 434 A2 | 8/2004 |
| JP | 2001222311 | 8/2001 |
| WO | WO 96/35187 | 11/1996 |
| WO | WO 02/21450 A1 | 3/2002 |

OTHER PUBLICATIONS

International Search Report, PCT/US2005/045141, May 15, 2006, pp. 1-6.
Written Opinion of the International Searching Authority, PCT/US2005/045141, May 15, 2006, pp. 1-7.
International Search Report, PCT/US2005/045143, Apr. 25, 2006, pp. 1-2.
Bhandarkar M P et al: "STEP-based feature extraction from STEP geometry for agile manufacturing" Computers in Industry Elsevier Netherlands, [Online} vol. 41, No. 1, Jan. 2000 pp. 1-24.

* cited by examiner

FIG. 10

SYSTEM, METHOD, AND ARTICLE OF MANUFACTURE FOR DETERMINING A PRODUCTIVITY RATE OF A MANUFACTURING SYSTEM

CROSS REFERENCE TO RELATED APPLICATIONS

The application claims the benefit of U.S. Provisional application, Ser. No. 60/635,879, filed Dec. 14, 2004, the contents of which are incorporated herein by reference thereto.

The application also claims the benefit of U.S. Provisional application, Ser. No. 60/635,881, filed Dec. 14, 2004, the contents of which are incorporated herein by reference thereto.

TECHNICAL FIELD

This application relates to a system, method, and article of manufacture for determining a productivity rate of a manufacturing system.

BACKGROUND

Manufacturing engineers generally determine a manufacturing system productivity rate by measuring a number of parts produced by a group of manufacturing cells over a predetermined time period. Accordingly, the manufacturing system productivity rate is determined after the manufacturing cells are operational. A disadvantage with this approach, however, is that if the manufacturing system productivity rate is less than a desired productivity rate, the manufacturing engineer may have to modify the manufacturing cells after the manufacturing cells have been constructed, which can delay the production date for manufacturing the part. Further, any modification to the manufacturing cells after installation thereof can result in dramatically increased expenses related to the manufacturing cells.

Accordingly, there is a need for a method of predicting a manufacturing system productivity rate prior to the construction of a group of manufacturing cells.

SUMMARY

A method for determining a productivity rate of a manufacturing system in accordance with exemplary embodiment is provided. The manufacturing system has first and second manufacturing cells. The first and second manufacturing cells has first and second machine, respectively. The method includes predicting a first cycle time indicating a time duration that a part is disposed in the first manufacturing cell utilizing a feature-based CAD model of the part. The method further includes predicting a second cycle time indicating a time duration that the part is disposed in the second manufacturing cell utilizing the feature-based CAD model of the part. The method further includes calculating a productivity rate of the first and second manufacturing system cells based on the first and second cycle times of the first and second manufacturing cells, respectively.

A system for determining a productivity rate of a manufacturing system in accordance with another exemplary embodiment is provided. The manufacturing system has first and second manufacturing cells. The first and second manufacturing cells have first and second machines, respectively. The system includes a computer configured to predict a first cycle time indicating a time duration that a part is disposed in the first manufacturing cell utilizing a feature-based CAD model of the part. The computer is further configured to predict a second cycle time indicating a time duration that the part is disposed in the second manufacturing cell utilizing the feature-based CAD model of the part. The computer is further configured to calculate a productivity rate of the first and second manufacturing system cells based on the first and second cycle times of the first and second manufacturing cells, respectively.

An article of manufacture in accordance with another exemplary embodiment is provided. The article of manufacture includes a computer storage medium having a computer program encoded therein for determining a productivity rate of a manufacturing system. The manufacturing system has first and second manufacturing cells. The first and second manufacturing cells have first and second machines, respectively. The computer storage medium includes code for predicting a first cycle time indicating a time duration that a part is disposed in the first manufacturing cell utilizing a feature-based CAD model of the part. The computer storage medium further includes code for predicting a second cycle time indicating a time duration that the part is disposed in the second manufacturing cell utilizing the feature-based CAD model of the part. The computer storage medium further includes code for calculating a productivity rate of the first and second manufacturing system cells based on the first and second cycle times of the first and second manufacturing cells, respectively.

BRIEF DESCRIPTION OF THE DRAWINGS

FIG. 10 is a schematic of a sixth computer screen generated by the system of FIG. 1;

DESCRIPTION OF EXEMPLARY EMBODIMENTS

Figure 1:
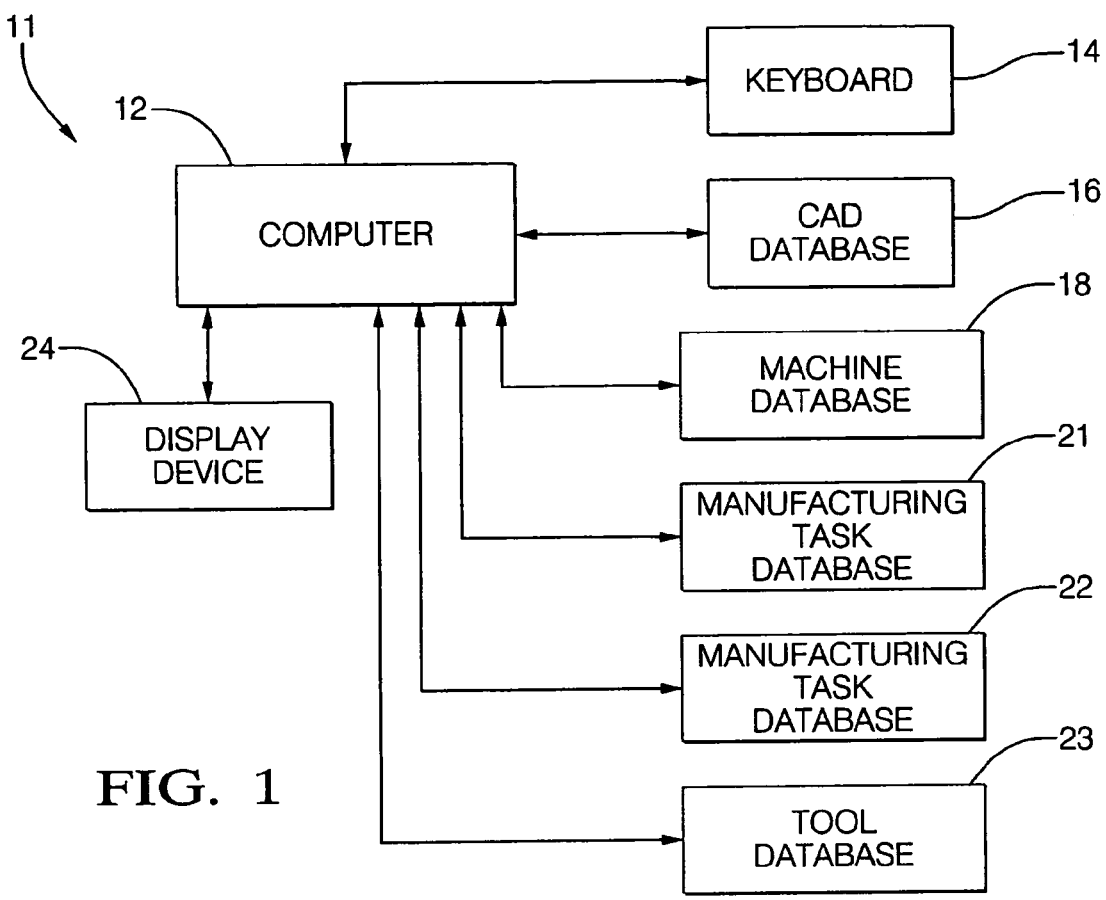
FIG. 1 is a schematic of a system for determining a productivity rate of a manufacturing system.
Figure 2:
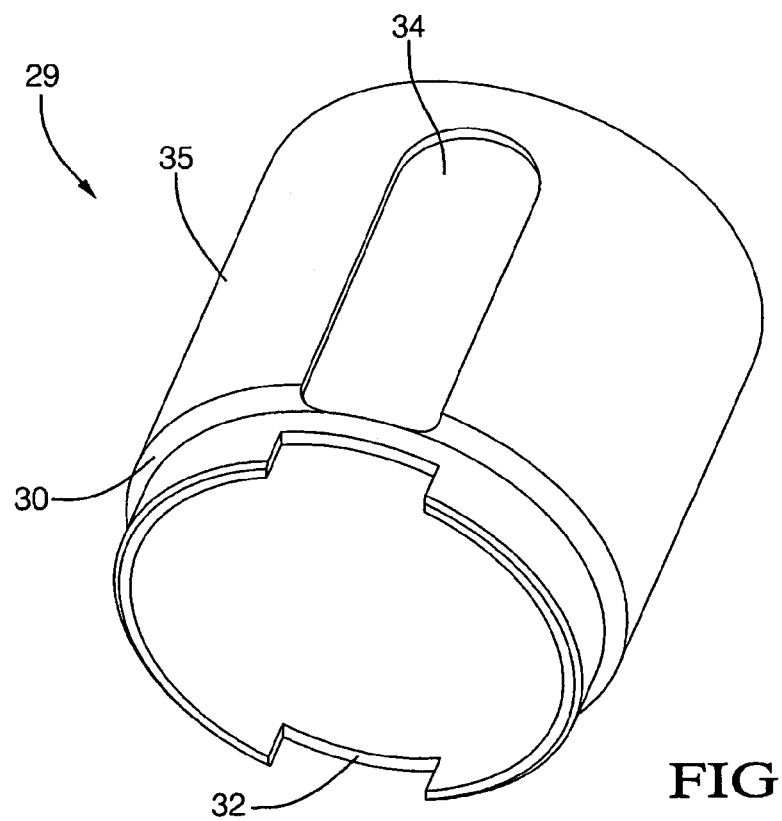
FIG. 2 is a schematic of a feature-based CAD model of a part utilized by the system of FIG. 1.

Referring to FIGS. 1 and 2, a system 11 for determining a productivity rate of a manufacturing system and a cost of manufacturing a part is illustrated. In particular, the system 11 utilizes a feature-based computer aided design (CAD) model of a part for determining a cost of manufacturing the part. The CAD model includes feature attributes, hereinafter referred to as "features", corresponding to the physical features of the part. Each feature includes feature parameter data associated therewith for defining the feature including a feature name and dimensional data. For example, the CAD model 29 includes a feature 30 having a feature name OD_GROOVE, a feature 32 having a feature name RADIAL_SLOT, a feature 34 having a feature name AXIAL_SLOT, and a feature 35 having a feature name OD_CHAMFER. The system 11 includes a computer 12, a keyboard 14, a CAD database 16, a machine database 18, a manufacturing task database 21, a manufacturing process plan database 22, a tool database 23, a display device 24, and a material cost database 25.

The computer 12 is provided to assist an operator in generating a process plan for forming features in a part and for determining a cost of manufacturing the part. The computer 12 is operably coupled to the keyboard 14. The computer 12 is further operably coupled to a display device 24 for displaying computer screens 40, 50, 60, 80, 90, and 150 for querying the operator for process information such as manufacturing task identifiers, machine identifiers, tool identifiers, and a task sequence. The computer is further operably coupled to the CAD database 16, the machine database 18, the manufacturing task database 21, the manufacturing process plan database 22, the tool database 23, and the material cost database 25.

The CAD database 16 is provided for storing feature-based CAD models of parts. A feature-based CAD model is a mathematical representation of a part having a plurality of editable features generated by feature modeling. Feature modeling is an ability to build up a CAD model by adding and connecting the plurality of editable features. Not all CAD software supports this capability. For example, AutoCAD uses a wireframe-and-surface methodology to build models rather than feature modeling. One important aspect of feature modeling is the generation of associative relationships between features, meaning the features are linked such that changes to one feature may alter the others to which it is associated. In particular, the CAD database 16 stores CAD model 29 therein. The computer 12 operably communicates with the CAD database 16 for retrieving predetermined CAD models therein.

The machine database 18 is provided for storing machine identifiers associated with machines. In particular, the machine identifiers comprise machine names or machine numbers identifying predetermined machines used in a manufacturing process. The computer 12 operably communicates with the machine database 18 for retrieving predetermined machine identifiers stored therein.

The manufacturing task database 21 is provided for storing a plurality of process task names for forming physical features in a part. The computer 12 operably communicates with the manufacturing task database 21 for retrieving process task names stored therein.

The manufacturing process plan database 22 is provided for storing a process plan determined by an operator utilizing the system 11. The computer 12 operably communicates with the manufacturing process plan database 22 for storing data associated with a generated process sequence therein.

The tool database 23 is provided for storing tool identifiers, such as tool names, that can be utilized with the one or more selected machines. The computer 12 operably communicates with the tool database 23 for retrieving tool identifiers stored therein.

The material cost database 25 is provided for storing a material cost for forming the part being manufactured. For example, when the part is formed from a steel tube, the material cost database 25 stores a cost associated with a portion of the steel tube used to manufacture the part. The computer 12 operably communicates with the material cost database 25 for retrieving material costs associated with the part being manufactured.

Before proceeding with a detailed discussion of a method for determining a productivity rate of a manufacturing system and a cost of manufacturing a part, a brief description of the computer screens generated by the computer 12 will now be described.

Figure 3:
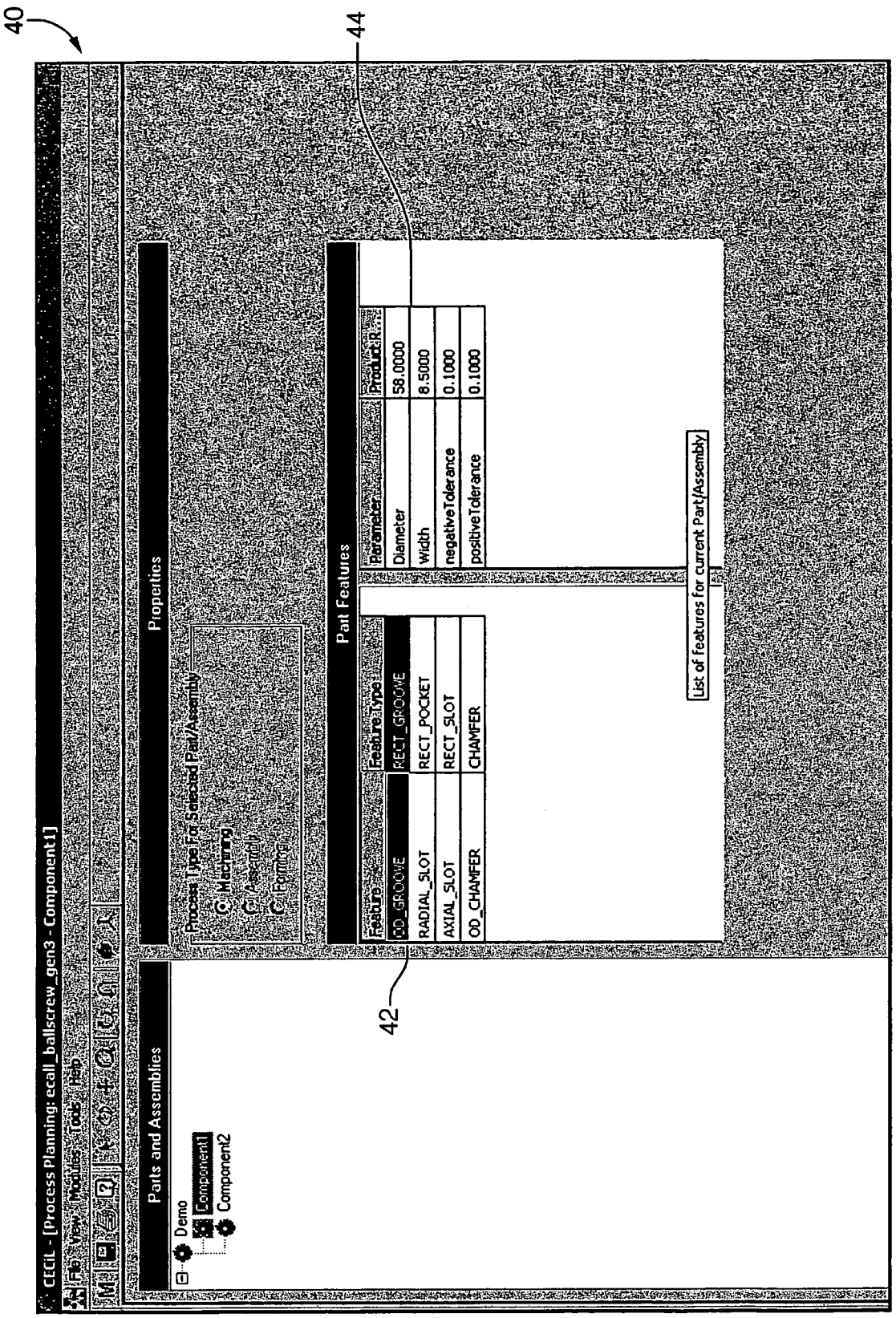
FIG. 3 is a schematic of a first computer screen generated by the system of FIG. 1.

Referring to FIG. 3, a computer screen 40 includes a feature menu 42 and a feature parameter menu 44. The feature menu 42 illustrates a plurality of records having the feature names OD_GROOVE, RADIAL_SLOT, AXIAL_SLOT, and OD_CHAMFER that are associated with the CAD model 29. The feature parameter menu 44 lists the other feature parameter data associated with one selected feature name in the feature menu 42.

Figure 4:
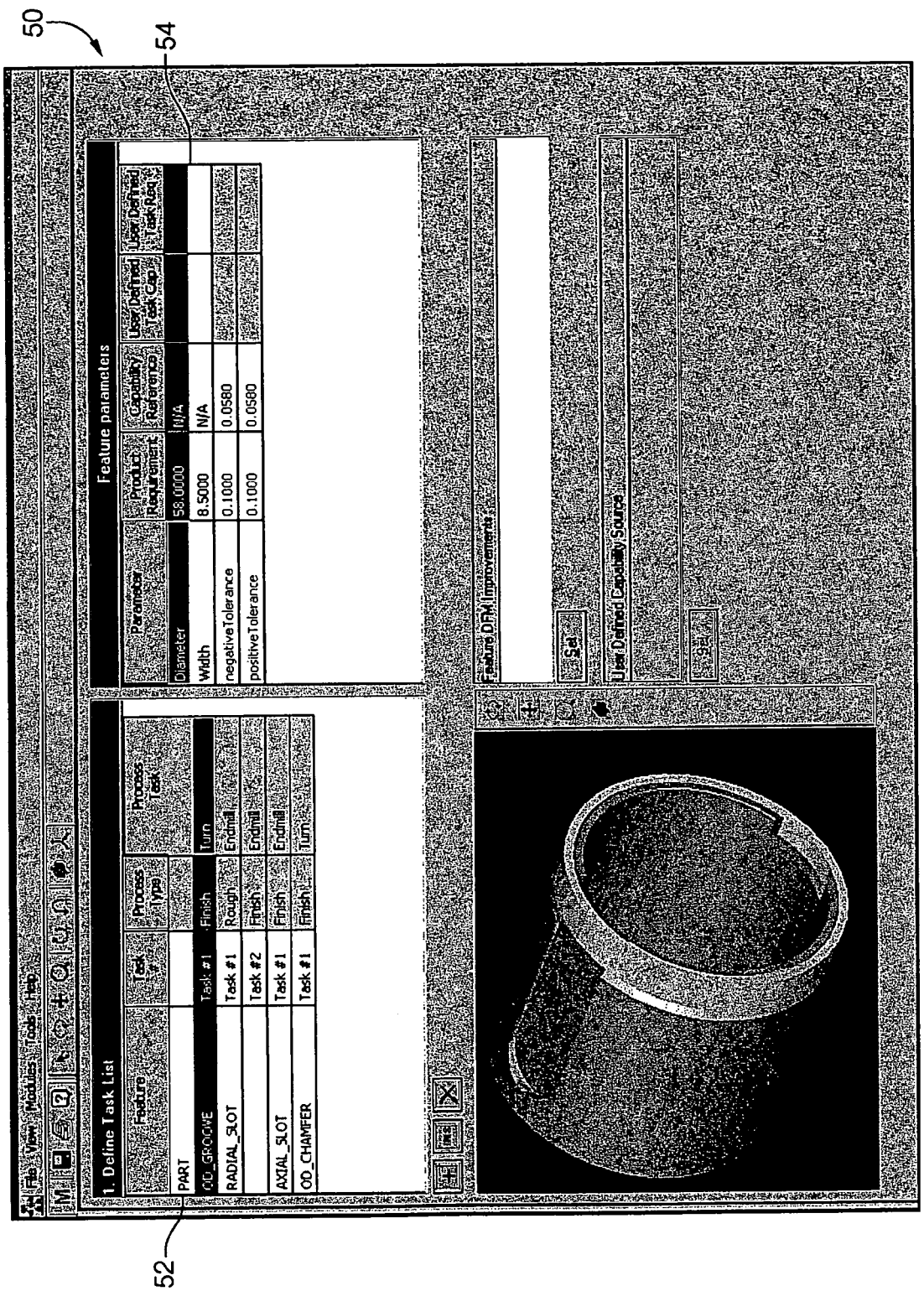
FIG. 4 is a schematic of a second computer screen generated by the system of FIG. 1.

Referring to FIG. 4, a computer screen 50 includes a task list menu 52 and a feature parameter menu 54. The task list menu 52 lists a plurality of records wherein each record has a feature name field, a task number field, a process type identifier field, and a task identifier field. For each listed record on menu 52, the operator can select (i) a task number from a plurality of task number, (ii) a process type indicator from a plurality of process type indicators, and (iii) a task identifier (e.g., process task name) from a plurality of task identifiers stored in the database 21. The feature parameter menu 54 lists the other feature parameter data associated with one selected feature name in the feature menu 52.

Figure 5:
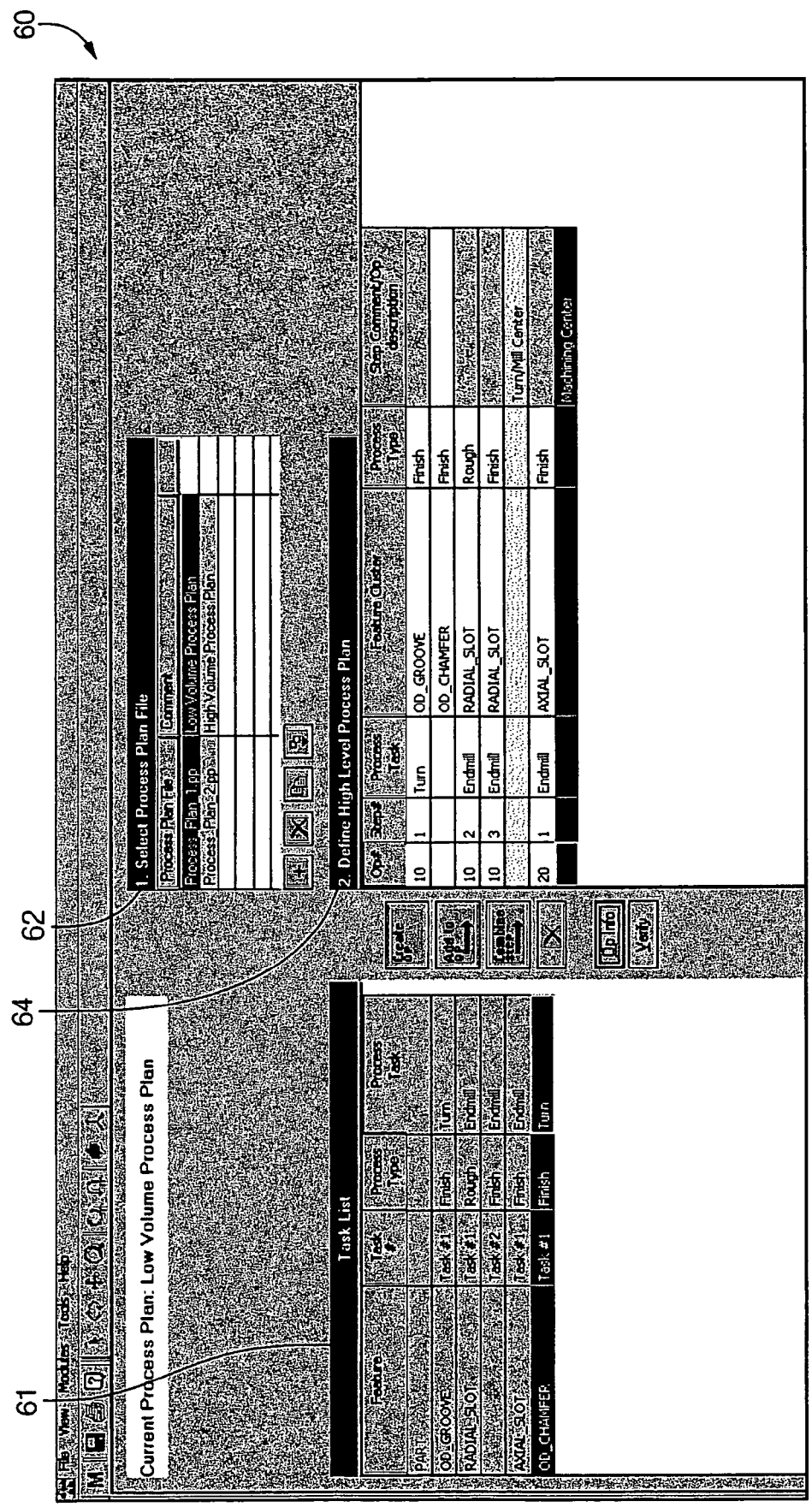
FIG. 5 is a schematic of a third computer screen generated by the system of FIG. 1.

Referring to FIG. 5, a computer screen 60 includes a select process plan file menu 62 and a define high-level process plan menu 64. The menu 62 allows an operator to generate a process plan file that will contain a developed process plan. Each process plan file represents a unique grouping of tasks for one or more machines used in a manufacturing process. Accordingly, an operator can generate a plurality of different process plans for different manufacturing volumes and machines. The menu 64 lists a plurality of records wherein each record comprises (i) a machine identifier (e.g. an OP #) from a plurality of machine identifiers, (ii) a step number indicating when a selected machine will perform a task during execution of a plurality of steps, (iii) a task identifier (e.g., a process task name) from a plurality of task identifiers, (iv) a feature cluster wherein an operator can group one or more feature names with a process task, and (v) a process type from a plurality of process types associated with each particular task identifier. The menu 64 allows a user to assign a task identifier from the process task names menu 61 to a machine identifier and a step number listed in the menu 64.

Figure 6:
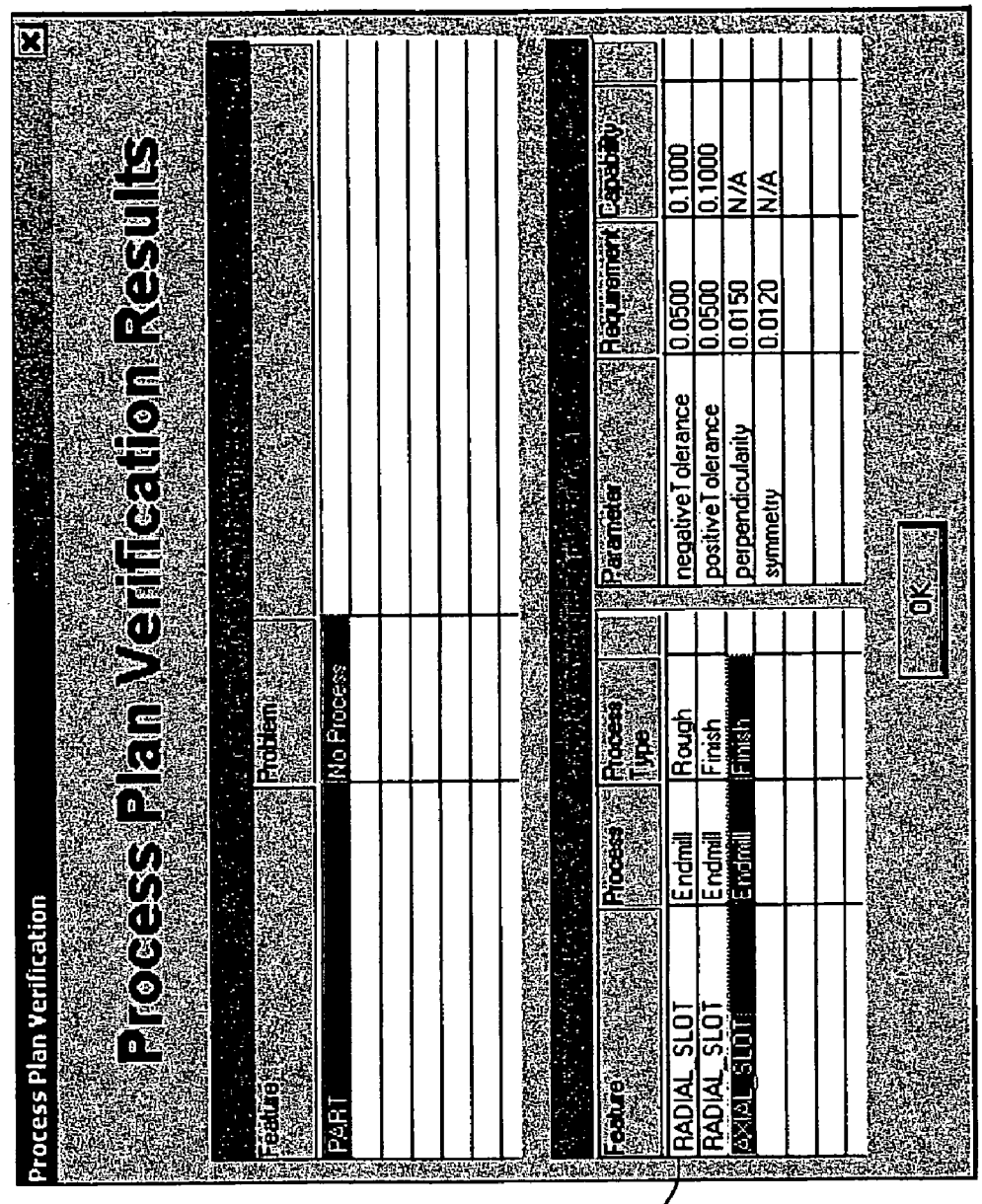
FIG. 6 is a schematic of a fourth computer screen generated by the system of FIG. 1.

Referring to FIG. 6, a computer screen 80 includes a process plan verification results section 82 that indicates features of the CAD model 29 having desired tolerances that are not within a manufacturing tolerance capability of a selected machine and manufacturing process.

Figure 7:
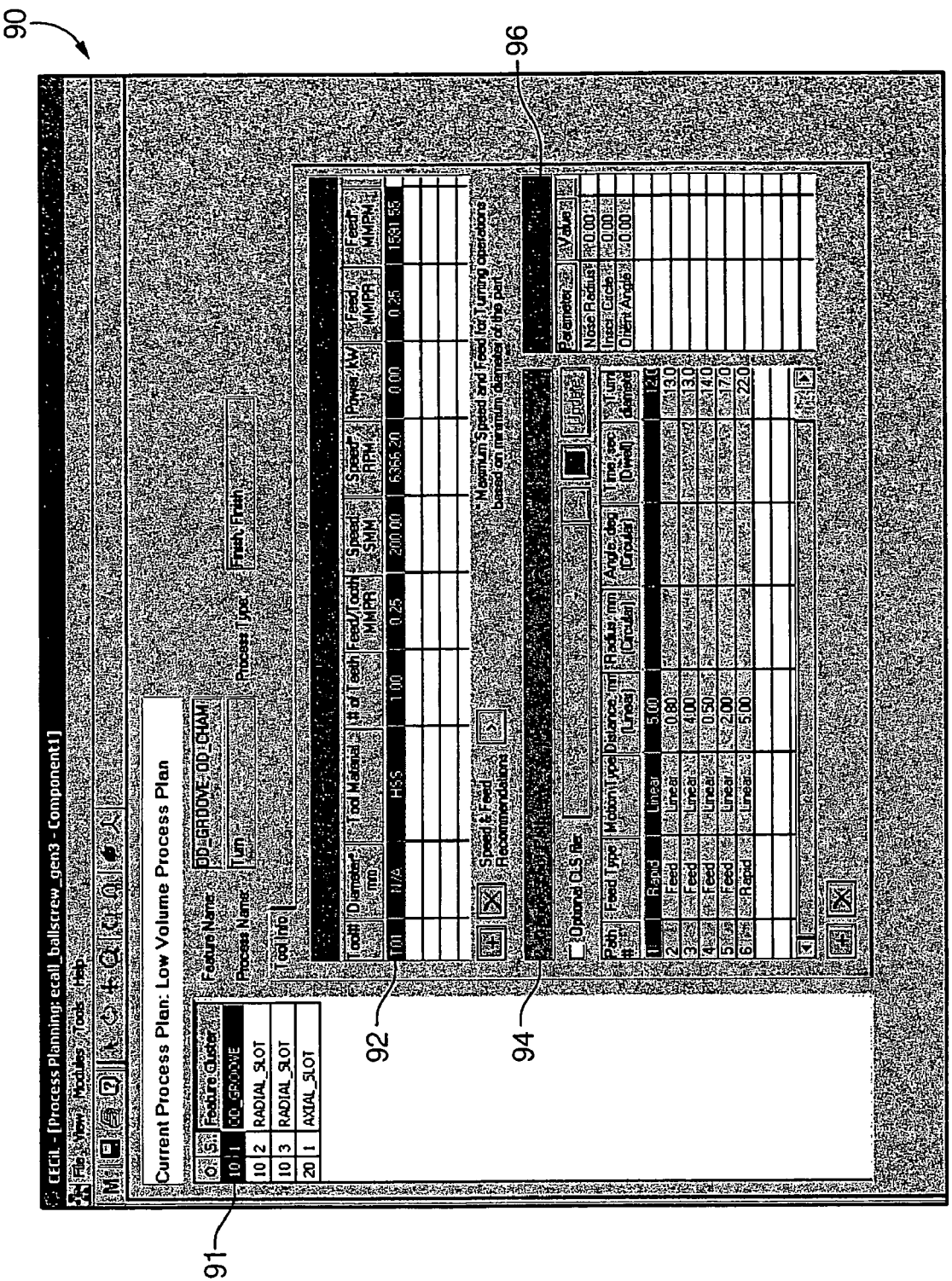
FIG. 7 is a schematic of a fifth computer screen generated by the system of FIG. 1.

Referring to FIG. 7, a computer screen 90 includes a feature selection menu 91, a define tool definition menu 92, a define tool path menu 94, and a tool visualization menu 96. The menu 91 allows an operator to select a feature for subsequently allowing a user to select a tool identifier (e.g., tool #) associated with a tool for forming the selected feature. As shown, the menu 92 includes a tool definition record having a tool number field, a diameter field, a tool material field, a number of teeth field, a feed-tooth field, first and second speed fields, a power field, and first and second feed rate fields. The tool identifier selected in the menu 92 is associated with the feature selected in the menu 91. The menu 94 allows a user to define a tool path that will be utilized by the tool identifier selected in the menu 92 for forming predetermined features.

Figure 8:
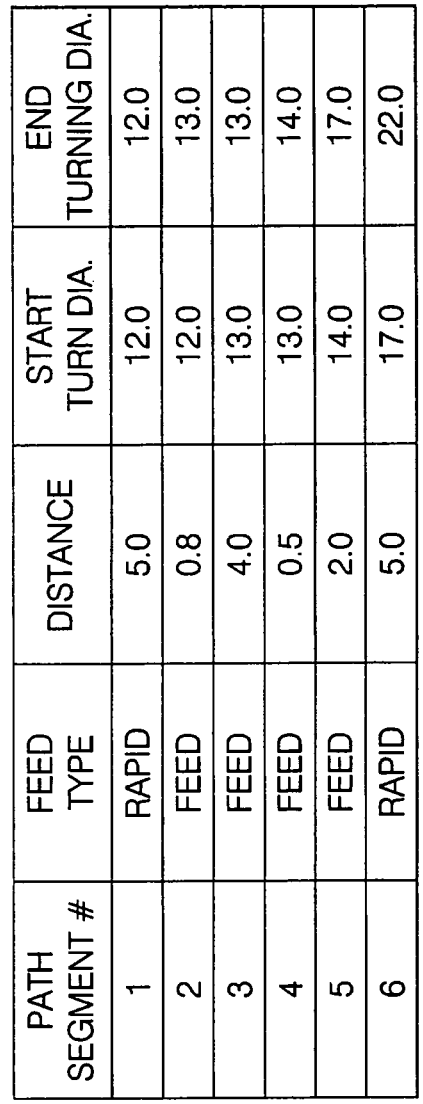
FIG. 8 depicts a portion of the fifth computer screen of FIG. 7.
Figure 9:
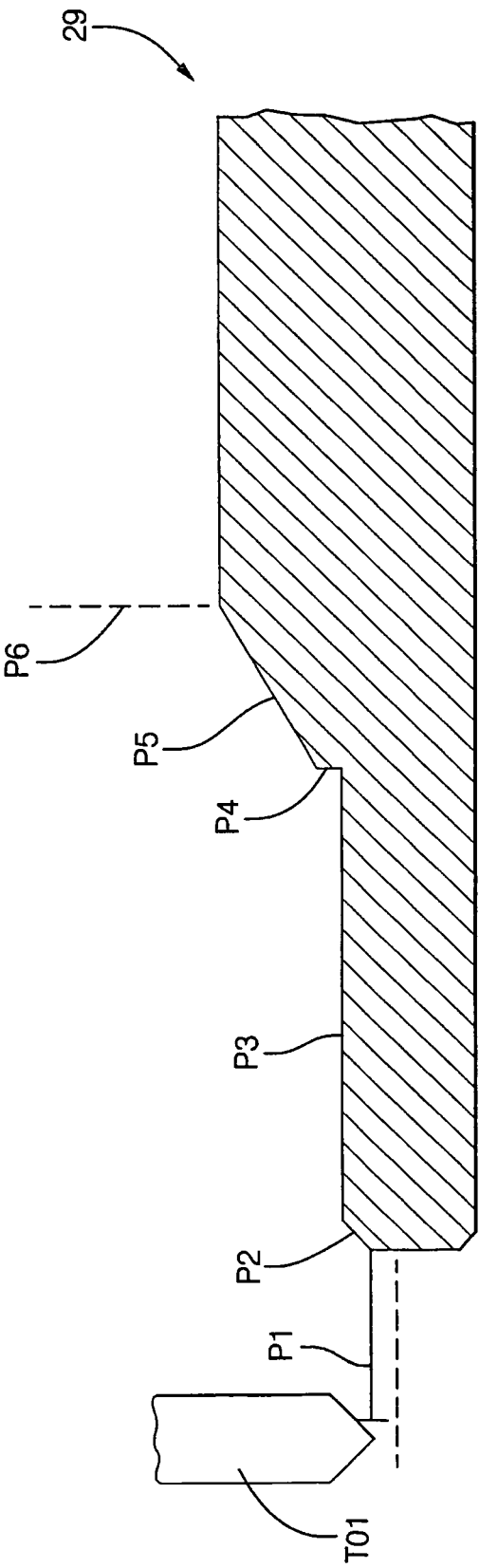
FIG. 9 depicts a portion of the CAD model of FIG. 2.

Referring to FIGS. 8 and 9, an exemplary menu 94 for determining a tool path for the tool T01 for forming the features 30, 35 corresponding to the OD_GROOVE and OD_CHAMFER feature names, are illustrated. The menu 94 includes a plurality of records wherein each record defines a path travel segment for the tool T01. Further, each of the records includes a travel path segment number field, a feed type field, a distance field, a start turn diameter field, and an end turning diameter field. The path segment numbers 1, 2, 3, 4, 5, 6 corresponds to one of the travel path segments P1, P2, P3, P4, P5, P6, respectively. The feed type field can contain either a value of "rapid" corresponding to a first predetermined linear cutting speed or a value of "feed" corresponding to a second predetermined linear cutting speed that is less than the first predetermined linear cutting speed. The distance field corresponds to tool travel distance in a path travel segment. The start turning diameter corresponds to a diameter of the part in a first end of the path travel segment. The end turning diameter corresponds to a diameter of the part at a second end of the corresponding path travel segment. It should be noted that development of one tool path for tool T01 is described in detail, the menu 94 would also be used for developing a tool path for each other selected tool.

Figure 10:
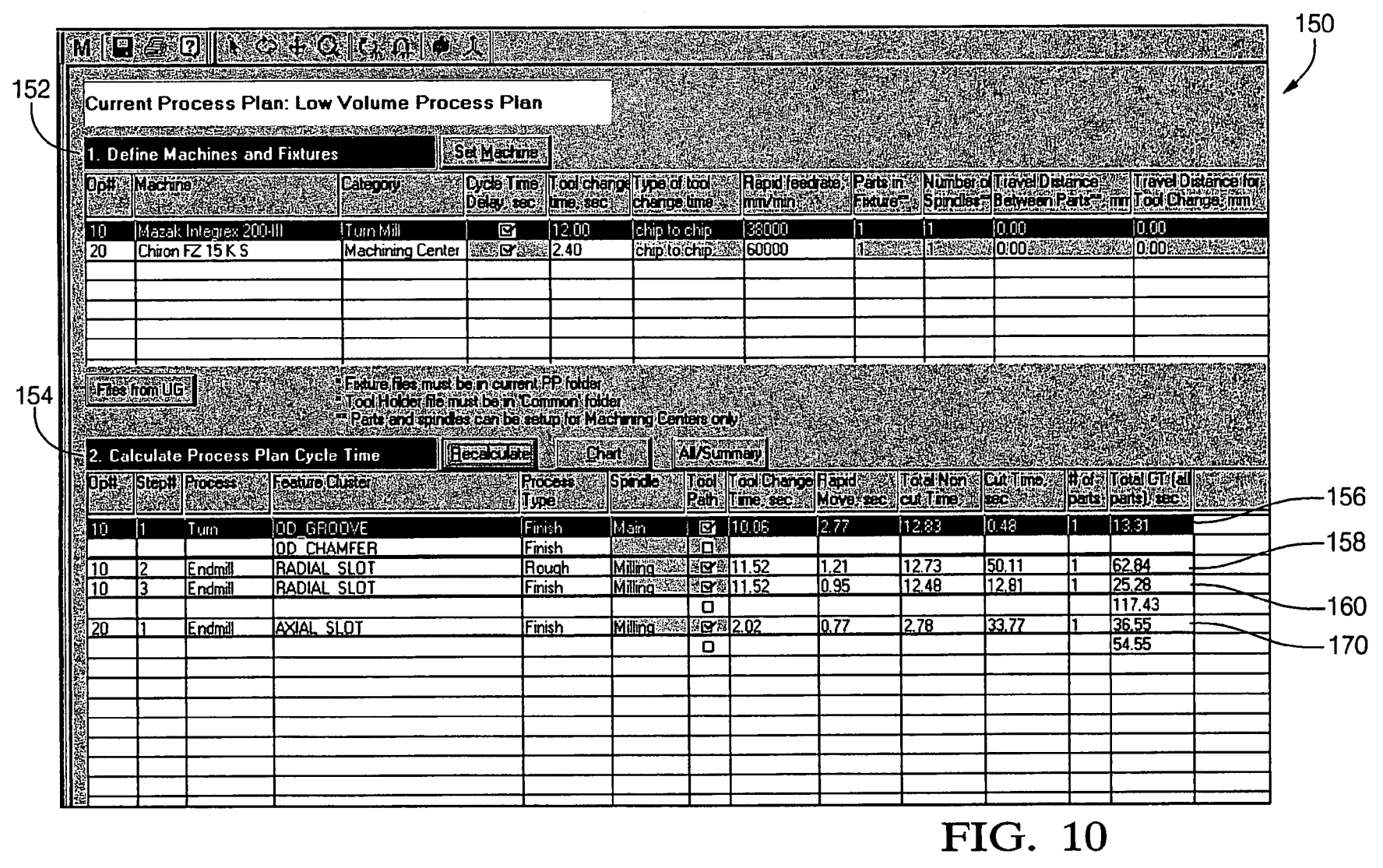

Referring to FIG. 10, a computer screen 150 includes a define machines and fixtures menu 152 and a process plan cycle time menu 154. The menu 152 allows an operator to define the parameters associated with the selected machine identifiers 10 and 20 that are associated with first and second machines, respectively, for forming features in a part. As shown, each record in the menu 152 includes a machine identifier field, a machine name field, a category field, a cycle time delay field, a tool change time field, a type of tool change time field, a rapid feed rate field, a parts in fixture field, a number of spindles field, a travel distance between parts field, and a travel distance for tool change field.

The menu 154 is provided for displaying a plurality of records wherein each record contains a calculated cycle time for forming one or more features of the part. Further, menu 154 displays a calculated total cycle time for each machine used to form features in the part. Each of the records displayed in the menu 154 includes a machine identifier field, a step number field, a process task field, a feature cluster field, a process type field, a spindle field, a tool path field, a tool change time field, a rapid move time field, a total non-cut time field, a cut time field, a number of parts field, and a calculated cycle time field.

Figure 11:
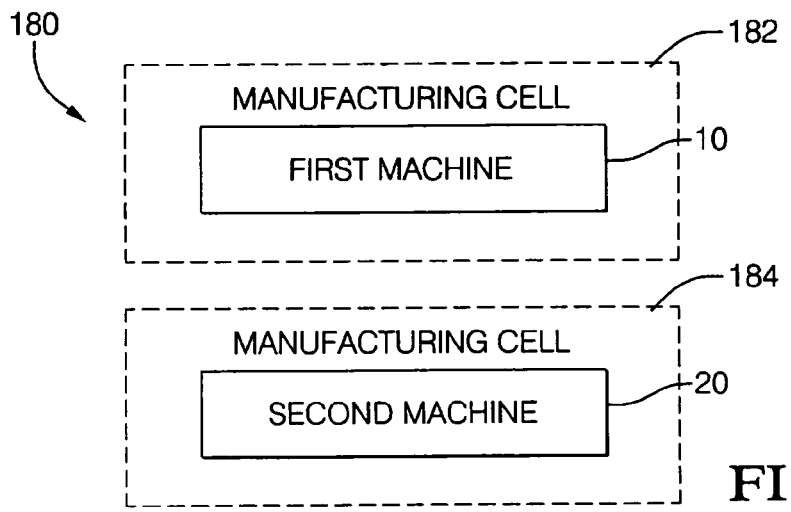
FIG. 11 is a schematic of a system for forming a plurality of features in a part having first and second manufacturing cells.
Figure 12:
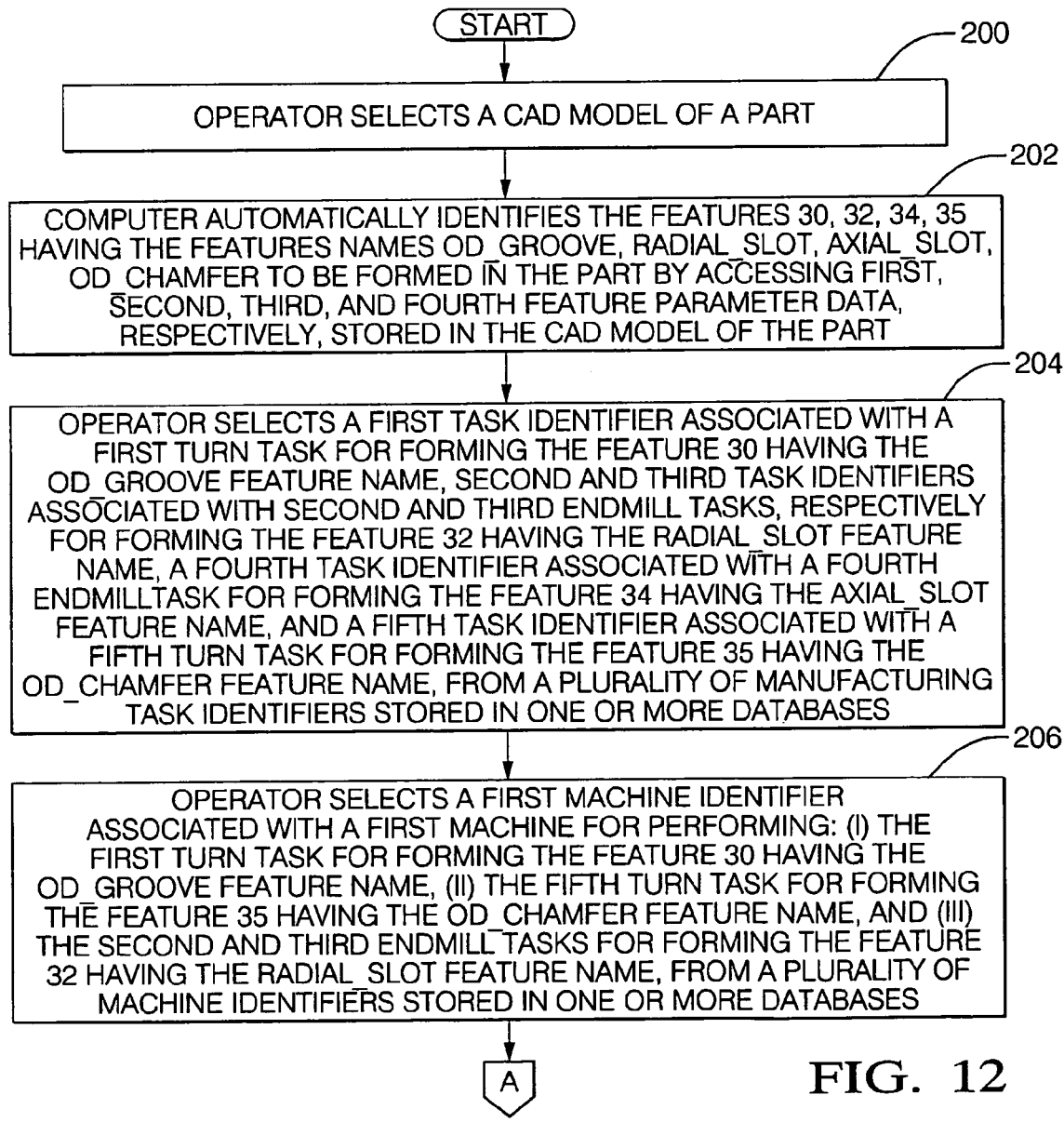
FIGS. 12-15 are flowcharts of a method for determining a productivity rate of a manufacturing system.
Figure 13:
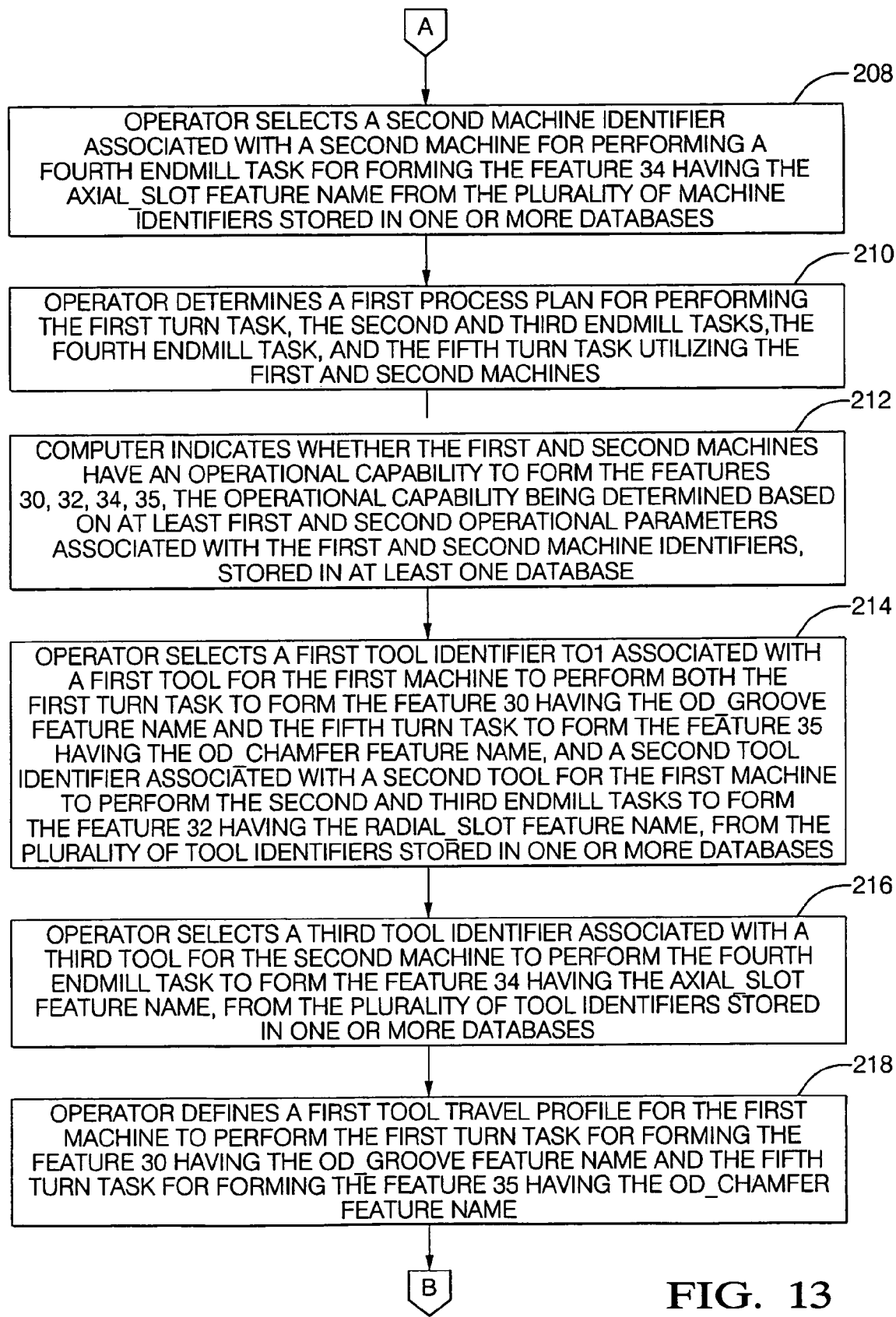
Figure 14:
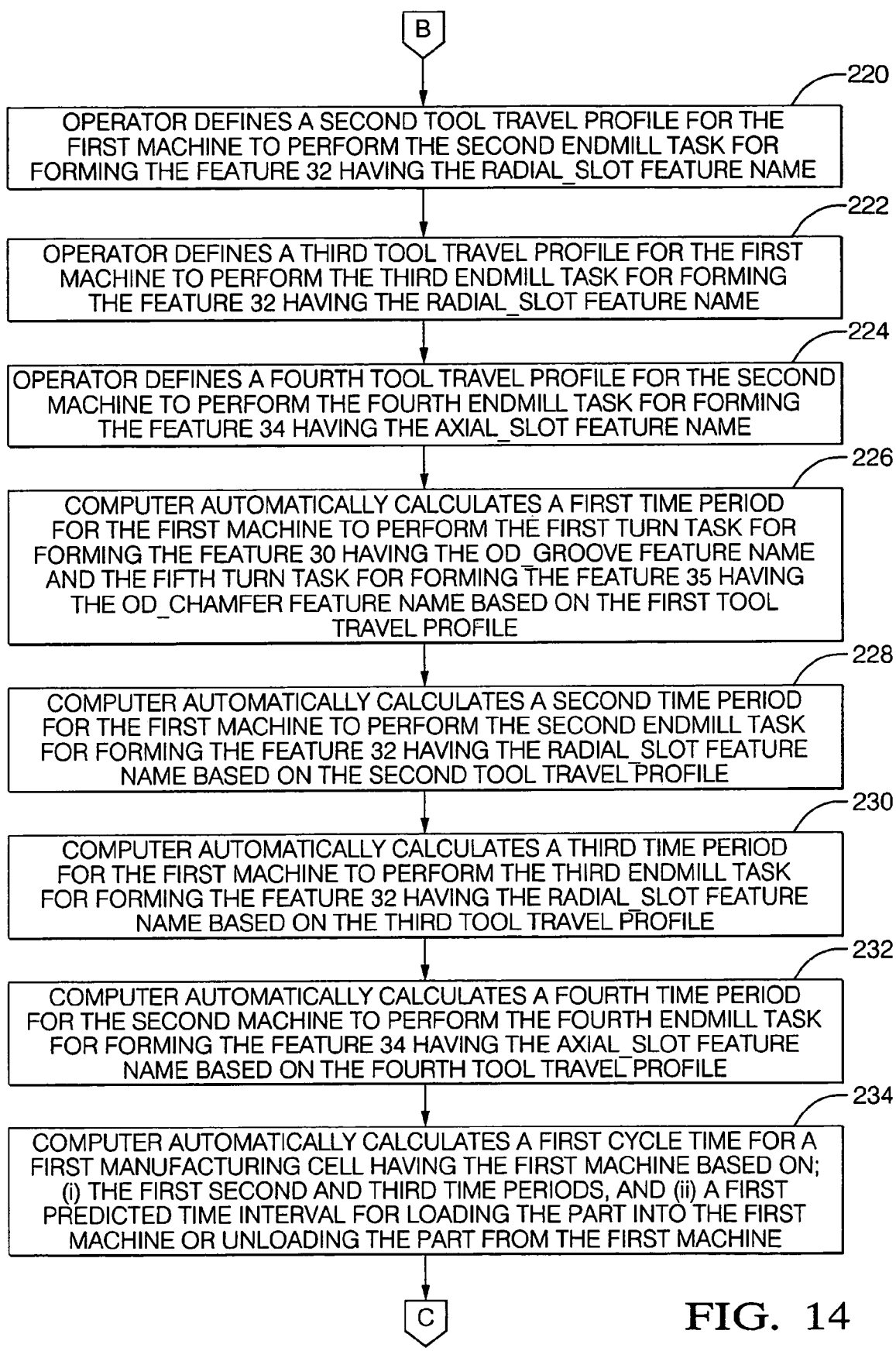
Figure 15:
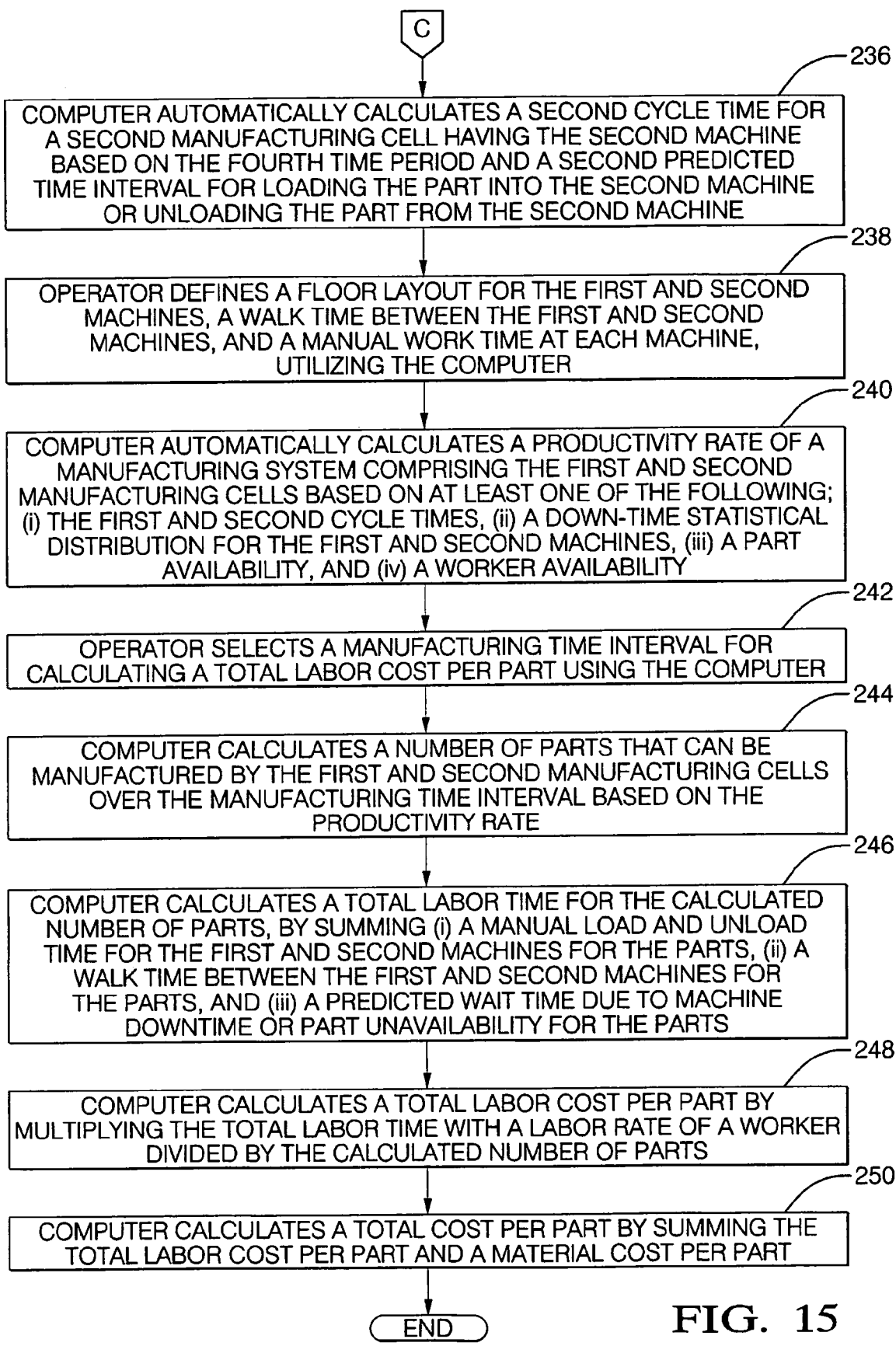

Referring to FIG. 11, a brief explanation of a system 180 for forming features in a part will be described. The system 180 includes manufacturing cells 182, 184 having first and second machines with machines identifiers 10, 20, respectively therein. The machine 10 is utilized for forming the features 30, 32, 35 in the part. The machine 20 is utilized for forming a feature 34 in the part. During operation, the part is first loaded into the machine 10 and features 30, 32, 35 are formed in the part. Thereafter, the part is unloaded from the machine 10 and loaded onto the machine 20. Thereafter the machine 20 forms the feature 34 in the part and the part is unloaded from the machine 20. The methodology described below will be utilized to determine a cost of manufacturing a part utilizing the system 180.

Referring to FIGS. 12-15 and FIGS. 3-7, and 10, a method for determining a productivity rates of a manufacturing system and a cost of manufacturing a part will now be described. The method is implemented in a software program configured to execute on the computer 12 of the system 11.

At step 200, an operator selects the CAD model 29 of a part utilizing the keyboard 14. Thereafter, the computer 12 retrieves the CAD model 29 from the CAD database 16.

Next at step 202, the computer 12 automatically identifies the features 30, 32, 34, 35 having the features names OD_GROOVE, RADIAL_SLOT, AXIAL_SLOT, OD_CHAMFER, respectively, to be formed in the part by accessing first, second, third, and fourth feature parameter data, respectively, stored in the CAD model of the part. The foregoing feature names are displayed in the menu 42 of the computer screen 40.

Next at step 204, the operator selects a first task identifier associated with a first TURN task for forming the feature 30 having the OD_GROOVE feature name, second and third task identifiers associated with second and third ENDMILL tasks, respectively, for forming the feature 32 having the RADIAL_SLOT feature name, a fourth task identifier associated with fourth ENDMILL task for forming the feature 34 having the AXIAL_SLOT feature name, and a fifth task identifier associated with a fifth TURN task for forming the feature 35 having the OD_CHAMFER feature name, from a plurality of manufacturing task identifiers stored in one or more databases. In particular, the operator makes the foregoing task identifier selections utilizing the menu 52 of the computer screen 50.

Next at step 206, an operator selects a machine identifier 10 associated with a first machine for performing: (i) the first TURN task for forming the feature 30 having the OD_GROOVE feature name, (ii) the fifth TURN task for forming the feature 35 having the OD_CHAMFER feature name, and (iii) the second and third ENDMILL tasks for forming the feature 32 having the RADIAL_SLOT feature name, from a plurality of machine identifiers stored in one or more databases. In particular, the operator makes the foregoing machine identifier selection utilizing the menu 64 of the computer screen 60.

Next at step 208, an operator selects a machine identifier 20 associated with a second machine for performing a fourth ENDMILL task for forming the feature 34 having the AXIAL_SLOT feature name from the plurality of machine identifiers stored in one or more databases. In particular, the operator makes the foregoing machine identifier selection utilizing the menu 64 of the computer screen 60.

Next at step 210, the operator determines a first sequence or process plan for performing the first TURN task, the second and third ENDMILL tasks, the fourth ENDMILL task, and the fifth TURN task utilizing the machines 10 and 20. In particular, the operator determines the first sequence by ordering the process tasks associated with each machine listed on the menu 64 of the computer screen 60.

Next at step 212, the computer 12 indicates whether the machines 10 and 20 have an operational capability to form the features 30, 32, 34, 35. The operational capability is determined based on at least first and second operational parameters associated with the machines 10 and 20, respectively, stored in the database 18. In particular, the computer 12 generates the computer screen 80 including the process plan verification results section 82 that indicates features of the CAD model 29 having a desired tolerance that is not within a manufacturing tolerance capability of a selected machine.

Next at step 214, the operator selects a first tool identifier T01 associated with a first tool for the machine 10 to perform both the first TURN task to form the feature 30 having the OD_GROOVE feature name and the fifth TURN task to form the feature 35 having the OD_CHAMFER feature name, and a second tool identifier (not shown) for the machine 10 to perform the second and third ENDMILL tasks to form the feature 32 having the RADIAL_SLOT feature name, from the plurality of tool identifiers stored in the database 18. In particular, the operator makes the foregoing tool identifier selection utilizing the computer screen 90.

Next at step 216, the operator selects a third tool identifier (not shown) associated with a third tool for the machine 20 to perform the fourth ENDMILL task to form the feature 34 having the AXIAL_SLOT feature name, from the plurality of tool identifiers stored in the database 18. In particular, the operator makes the foregoing tool identifier selection utilizing the computer screen 90.

Next at step 218, the operator defines a first tool travel profile for the machine 10 to perform the first TURN task for forming the feature 30 having the OD_GROOVE feature name and the fifth TURN task for forming the feature 35 having the OD_CHAMFER feature name. In particular, the operator defines the first tool travel profile utilizing the menu 94 of the computer screen 90.

Next at step 220, the operator defines a second tool travel profile (not shown) for the machine 10 to perform the second ENDMILL task for forming the feature 32 having the RADIAL_SLOT feature name. In particular, the operator defines the second tool travel profile utilizing the menu 94 of the computer screen 90.

Next at step 222, the operator defines a third tool travel profile (not shown) for the machine 10 to perform the third ENDMILL task for forming the feature 32 having the RADIAL_SLOT feature name. In particular, the operator defines the third tool travel profile utilizing the menu 94 of the computer screen 90.

Next at step 224, the operator defines a fourth tool travel profile (not shown) for the machine 20 to perform the fourth ENDMILL task for forming the feature 34 having the AXIAL_SLOT feature name. In particular, the operator defines the fourth tool travel profile utilizing the menu 94 of the computer screen 90.

Next at step 226, the computer 12 automatically calculates a first time period for the machine 10 to perform the first TURN task for forming the feature 30 having the OD_GROOVE feature name and the fifth TURN task for forming the feature 35 having the OD_CHAMFER feature name based on the first tool travel profile. In particular, the computer 12 automatically calculates the first time period corresponding to a cycle time of the machine 10 performing the features 30, 35 and displays the first time period in the record 156 on the menu 154.

Next at step 228, the computer 12 automatically calculates a second time period for the machine 10 to perform the second ENDMILL task for forming the feature 32 having the RADIAL_SLOT feature name based on the second tool travel profile. In particular, the computer 12 automatically calculates the second time period corresponding to a cycle time of the machine 10 performing the feature 32 and displays the second time period in the record 158 on the menu 154.

Next at step 230, the computer 12 automatically calculates a third time period for the machine 10 to perform the third ENDMILL task for forming the feature 32 having the RADIAL_SLOT feature name based on the third tool travel profile. In particular, the computer 12 automatically calculates the third time period corresponding to a cycle time of the machine 10 performing the feature 32 and displays the third time period in the record 160 on the menu 154.

Next at step 232, the computer 12 automatically calculates a fourth time period for the machine 20 to perform the fourth ENDMILL task for forming the feature 34 having the AXIAL_SLOT feature name based on the fourth tool travel profile. In particular, the computer 12 automatically calculates the fourth time period corresponding to a cycle time of the machine 20 performing the feature 34 and displays the fourth time period in the record 170 on the menu 154.

Next at step 234, the computer 12 automatically calculates a first cycle time for the manufacturing cell 182 having the machine 10 based on: (i) the first, second, and third time periods, and (ii) a first predicted time interval for loading the part into the machine 10 or unloading the part from the machine 10.

Next at step 236, the computer 12 automatically calculates a second cycle time for the manufacturing cell 184 having the machine 20 based on the fourth time period and a second predicted time interval for loading the part into the machine 20 or unloading the part from the machine 20.

Next at step 238, the operator defines a floor layout for the machines 10 and 20, a walk time between the machines 10 and 20, and a manual work time at each machine, utilizing the computer 12.

Next at step 240, the computer 12 automatically calculates a productivity rate of a manufacturing system comprising the manufacturing cells 182, 184 based on at least one of the following: (i) the first and second cycle times, (ii) a downtime statistical distribution for the machines 10 and 20, (iii) a part availability, and (iv) a worker availability.

Next at step 242, the operator selects a manufacturing time interval for calculating a total labor cost per part, using the computer 12.

Next at step 244, the computer 12 calculates a number of parts that can be manufactured by the manufacturing cells 182, 184 over the manufacturing time interval based on the productivity rate.

Next at step 246, the computer 12 calculates a total labor time for the calculated number of parts, by summing: (i) a manual load and unload time for the machines 10 and 20 for the parts, (ii) a walk time between the machines 10 and "20 for the parts, and (iii) a predicted wait time due to machine downtime or part unavailability for the parts.

Next at step 248, the computer 12 calculates a total labor cost per part by multiplying the total labor time with a labor rate of a worker divided by the calculated number of parts.

Finally, at step 250, the computer 12 calculates a total cost per part by summing the total labor cost per part and a material cost per part. After step 250, the method is exited.

A computer-readable storage medium accessed by the computer 12 stores a series of computer-executable instructions which will implement the above-described method. The computer-readable storage medium can comprise any device capable of storing computer executable instructions. For example, the computer readable storage medium can comprise a RAM or ROM of the computer, a computer diskette, a CD ROM, a flash memory device, a magnetic tape, a conventional hard disk drive, and an optical storage device, or the like.

The system and the method for determining a productivity rate of a manufacturing system provide a substantial advantage over other systems and methods. In particular, the system and method allows an engineer to determine a productivity rate of the manufacturing system prior to physically constructing manufacturing cells contained in the manufacturing system.

What is claimed is:

1. A method for determining a productivity rate of a manufacturing system, the manufacturing system having first and second manufacturing cells, the first and second manufacturing cells having first and second machines, respectively, the method comprising:

automatically identifying first and second features in a part by accessing first and second parameter data, respectively, stored in a feature-based CAD model of the part, utilizing a computer;

predicting a first cycle time indicating a time duration that the part is disposed in the first manufacturing cell by calculating a first predicted time period for the first machine in the first manufacturing cell to perform at least one manufacturing task for forming the first feature in the part based on a first tool travel profile, and calculating a second predicted time period for loading the part into the first machine or unloading the part from the first machine, and adding the first predicted time period to the second predicted time period to obtain the first cycle time, utilizing the computer;

predicting a second cycle time indicating a time duration that the part is disposed in the second manufacturing cell by calculating a third predicted time period for the second machine in the second manufacturing cell to perform at least one manufacturing task for forming the second feature in the part based on a second tool travel profile, and calculating a fourth predicted time period for loading the part into the second machine or unloading the part from the second machine, and adding the third predicted time period to the fourth predicted time period to obtain the second cycle time, utilizing the computer; and calculating a productivity rate of the first and second manufacturing system cells based on the first and second cycle times of the first and second manufacturing cells, respectively.

2. The method of claim 1, further comprising:
calculating a labor cost per part based on the productivity rate and a manufacturing time interval; and
calculating a total cost per part based on the labor cost per part and a material cost per part.

3. A system for determining a productivity rate of a manufacturing system, the manufacturing system having first and second manufacturing cells, the first and second manufacturing cells having first and second machines, respectively, the system comprising:

a computer configured to automatically identify first and second features in a part by accessing first and second parameter data, respectively, stored in a feature-based CAD model of the part;

the computer further configured to predict a first cycle time indicating a time duration that the part is disposed in the first manufacturing cell by calculating a first predicted time period for the first machine in the first manufacturing cell to perform at least one manufacturing task for forming the first feature in the part based on a first tool travel profile, and calculating a second predicted time period for loading the part into the first machine or unloading the part from the first machine, and adding the first predicted time period to the second predicted time period to obtain the first cycle time;

the computer further configured to predict a second cycle time indicating a time duration that the part is disposed in the second manufacturing cell by calculating a third predicted time period for the second machine in the second manufacturing cell to perform at least one manufacturing task for forming the second feature in the part based on a second tool travel profile, and calculating a fourth predicted time period for loading the part into the second machine or unloading the part from the second machine, and adding the third predicted time period to the fourth predicted time period to obtain the second cycle time; and the computer further configured to calculate a productivity rate of the first and second manufacturing system cells based on the first and second cycle times of the first and second manufacturing cells, respectively.

4. The system of claim 3, wherein the computer is further configured to calculate a labor cost per part based on the productivity rate and a manufacturing time interval, the computer further configured to calculate a total cost per part based on the labor cost per part and a material cost per part.

5. A computer readable medium having computer-executable instructions
for performing a method of determining a productivity rate of a manufacturing system, the manufacturing system having a first and second manufacturing cells, the first and second manufacturing cells having first and second machines, respectively, the method comprising:

automatically identifying first and second features in a part by accessing first and second parameter data, respectively, stored in a feature-based CAD model of the part;

predicting a first cycle time indicating a time duration that the part is disposed in the first manufacturing cell by calculating a first predicted time period for the first machine in the first manufacturing cell to perform at least one manufacturing task for forming the first feature in the part based on a first tool travel profile, and calculating a second predicted time period for loading the part into the first machine or unloading the part from the first machine, and adding the first predicted time period to the second predicted time period to obtain the first cycle time;

predicting a second cycle time indicating a time duration that the part is disposed in the second manufacturing cell by calculating a third predicted time period for the second machine in the second manufacturing cell to perform at least one manufacturing task for forming the second feature in the part based on a second tool travel profile, and calculating a fourth predicted time period for loading the part into the second machine or unloading the part from the second machine, and adding the third predicted time period to the fourth predicted time period to obtain the second cycle time; and calculating a productivity rate of the first and second manufacturing system cells based on the first and second cycle times of the first and second manufacturing cells, respectively.

6. The computer readable medium of claim 5, wherein the method further comprises:
calculating a labor cost per part based on the productivity rate and a manufacturing time interval; and
calculating a total cost per part based on the labor cost per part and a material cost per part.

* * * * *